(12) United States Patent
Tanaka

(10) Patent No.: US 12,165,853 B2
(45) Date of Patent: Dec. 10, 2024

(54) CERAMIC SINTERED BODY AND MEMBER FOR PLASMA PROCESSING APPARATUS

(71) Applicant: KYOCERA Corporation, Kyoto (JP)

(72) Inventor: Manpei Tanaka, Higashiomi (JP)

(73) Assignee: KYOCERA CORPORATION, Kyoto (JP)

( * ) Notice: Subject to any disclaimer, the term of this patent is extended or adjusted under 35 U.S.C. 154(b) by 925 days.

(21) Appl. No.: 17/254,072

(22) PCT Filed: Jun. 27, 2019

(86) PCT No.: PCT/JP2019/025653
§ 371 (c)(1),
(2) Date: Dec. 18, 2020

(87) PCT Pub. No.: WO2020/004563
PCT Pub. Date: Jan. 2, 2020

(65) Prior Publication Data
US 2021/0265140 A1    Aug. 26, 2021

(30) Foreign Application Priority Data

Jun. 28, 2018 (JP) .................................. 2018-123033

(51) Int. Cl.
| | | |
|---|---|---|
| C04B 35/505 | (2006.01) | |
| H01J 37/32 | (2006.01) | |
| H01L 21/67 | (2006.01) | |

(52) U.S. Cl.
CPC ...... *H01J 37/32715* (2013.01); *C04B 35/505* (2013.01); *H01L 21/67069* (2013.01);
(Continued)

(58) Field of Classification Search
None
See application file for complete search history.

(56) References Cited

U.S. PATENT DOCUMENTS

2003/0049499 A1*  3/2003  Murakawa .............. C04B 35/44
                                                              428/697
2011/0067815 A1*  3/2011  Iizuka .................. H01J 37/3244
                                                              156/345.34
(Continued)

FOREIGN PATENT DOCUMENTS

| EP | 0552635 A1 | 7/1993 |
|---|---|---|
| JP | 2001-181042 A | 7/2001 |

(Continued)

OTHER PUBLICATIONS

Translation JP-2005097685-A; Hayazaki T; Apr. 2005 (Year: 2005).*

*Primary Examiner* — Humera N. Sheikh
*Assistant Examiner* — Elizabeth D Ivey
(74) *Attorney, Agent, or Firm* — Procopio, Cory, Hargreaves & Savitch LLP

(57) ABSTRACT

The ceramic sintered body of the present disclosure has yttrium oxide as a main component and contains yttrium silicate, and a ratio ($I_1/I_0$) of a maximum peak intensity $I_1$ of yttrium silicate having a diffraction angle 2θ of 30° to 32° with respect to a maximum intensity Io of yttrium oxide having a diffraction angle 2θ of 28° to 30°, which is obtained by an X-ray diffraction method, is 0.03 or more and 0.12 or less. The member for the plasma processing apparatus is made of the ceramic sintered body, its inside is a cylindrical body which serves as a flow path for a plasma generating gas, and an inner peripheral surface of the cylindrical body contains a larger amount of yttrium silicate than an outer peripheral surface thereof.

5 Claims, 4 Drawing Sheets

(52) U.S. Cl.
CPC ............... *C04B 2235/3222* (2013.01); *C04B 2235/3225* (2013.01); *C04B 2235/3427* (2013.01); *C04B 2235/75* (2013.01); *H01J 2237/334* (2013.01)

(56) References Cited

U.S. PATENT DOCUMENTS

| | | | |
|---|---|---|---|
| 2017/0140902 A1* | 5/2017 | Simpson | ............. C23C 16/4404 |
| 2018/0312974 A1 | 11/2018 | Noguchi et al. | |

FOREIGN PATENT DOCUMENTS

| | | | | |
|---|---|---|---|---|
| JP | 2005-97685 | A | | 4/2005 |
| JP | 2005097685 | A | * | 4/2005 |
| JP | 2008-260651 | A | | 10/2008 |
| WO | 2017/073679 | A1 | | 5/2017 |

* cited by examiner

CERAMIC SINTERED BODY AND MEMBER FOR PLASMA PROCESSING APPARATUS

TECHNICAL FIELD

This disclosure relates to a ceramic sintered body and a member for a plasma processing apparatus.

BACKGROUND ART

Conventionally, in a process for manufacturing a semiconductor or a process for manufacturing a liquid crystal, plasma has been used in a film forming apparatus for forming a thin film on a substrate such as a semiconductor wafer or a glass substrate and an etching apparatus for performing a microfabrication on a substrate. In the film forming apparatus, a raw material gas is introduced into a chamber, and the raw material gas is used to excite atoms and molecules by plasma to form a thin film on a substrate. Further, in the etching apparatus, a halogen corrosive gas is introduced into a chamber as a raw material gas, and the raw material gas is converted into plasma and used as an etching gas to perform a microfabrication on a substrate.

As a member exposed to such a plasma atmosphere, in Patent Document 1, the applicant proposes a ceramic sintered body containing yttria ($Y_2O_3$) as a main component and at least one or more kind of Zr, Si, Ce or Al in an amount of 3 to 50,000 mass ppm as a sintering aid.

PRIOR ART DOCUMENTS

Patent Document

[Patent documents 1] Japanese Patent Unexamined Publication No. 2001-181042

SUMMARY OF THE INVENTION

The ceramic sintered body of the present disclosure has yttrium oxide as a main component, contains yttrium silicate, and has a ratio ($I_1/I_0$) of a maximum peak intensity $I_1$ of yttrium silicate having a diffraction angle $2\theta$ of 30° to 32° with respect to a maximum intensity $I°$ of yttrium oxide having a diffraction angle $2\theta$ of 28° to 30°, which is obtained by an X-ray diffraction method, is 0.03 or more and 0.12 or less.

The member for the plasma processing apparatus of the present disclosure is made of the ceramic sintered body of the present disclosure, its inside is a cylindrical body which serves as a flow path for a plasma generating gas, and an inner peripheral surface of the cylindrical body contains a larger amount of yttrium silicate than an outer peripheral surface of the cylindrical body.

PREFERRED EMBODIMENTS FOR CARRYING OUT THE INVENTION

Hereinafter, the ceramic sintered body and the member for the plasma processing apparatus of the present disclosure are described below in detail with reference to the figures.

Figure 1A:
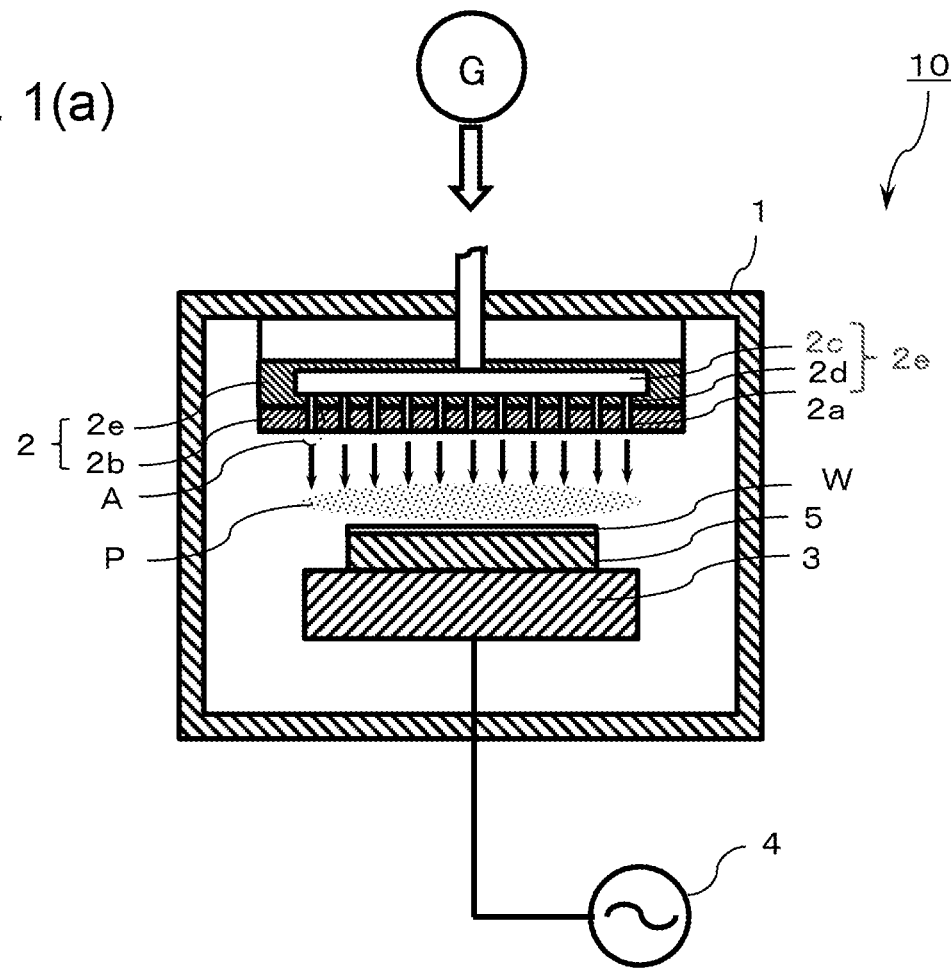
FIG. 1(a) is a cross sectional view showing a part of a plasma processing apparatus having an upper electrode equipped with gas passage pipes, which is a member for a plasma processing apparatus of the present disclosure.
Figure 1B:
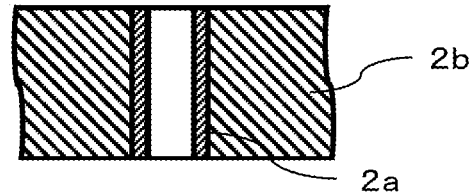
FIG. 1(b) is an enlarged view of the part A of FIG. 1(a).

FIG. 1(a) is a cross-sectional view showing a part of the plasma processing apparatus having an upper electrode equipped with gas passage pipes, which is a member for a plasma processing apparatus of the present disclosure, and FIG. 1(b) is an enlarged view of the part A of FIG. 1(a).

Figure 2:
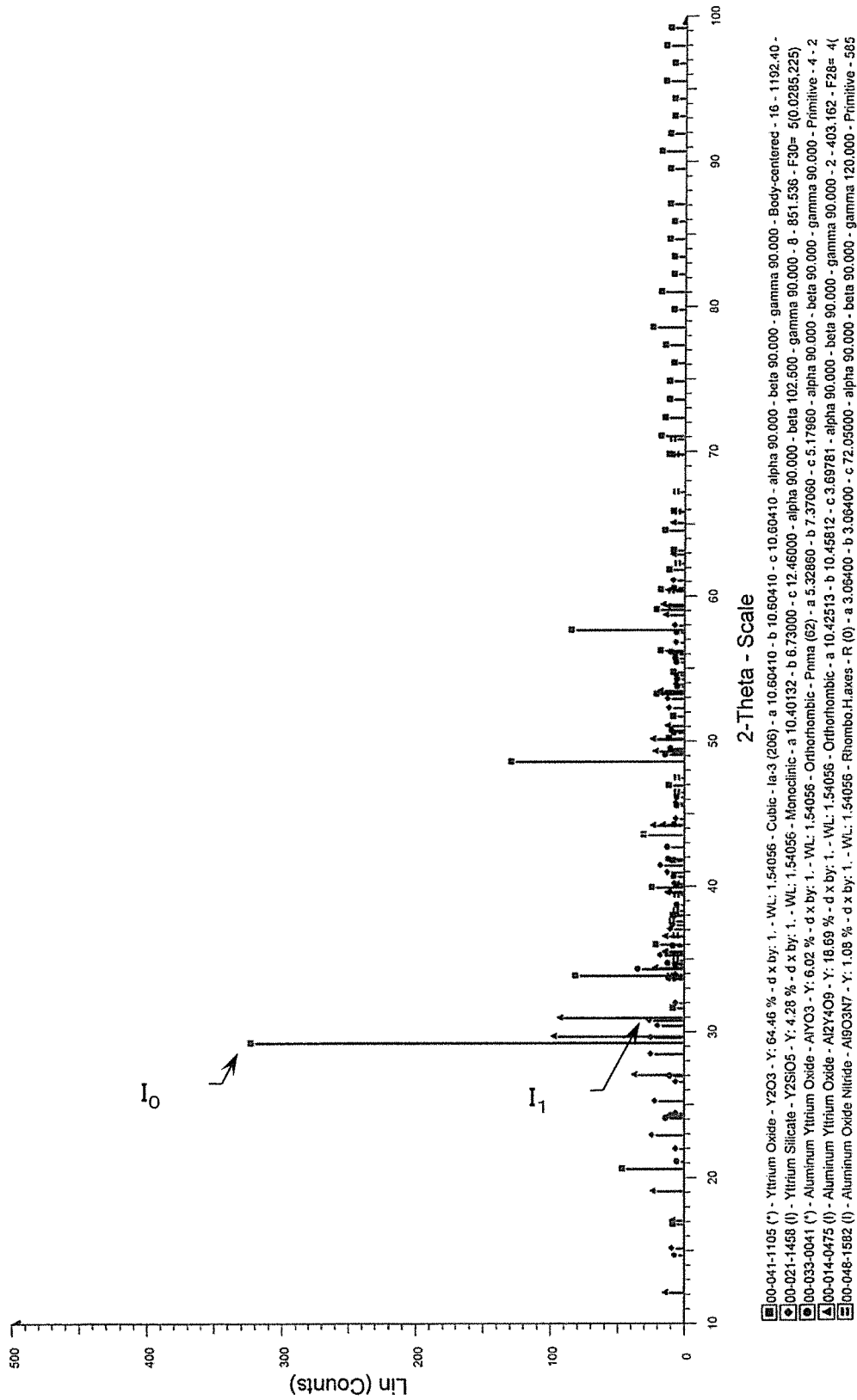
FIG. 2 is an example of an X-ray diffraction chart of the inner peripheral surface of the gas passage pipe shown in FIG. 1.
Figure 3:
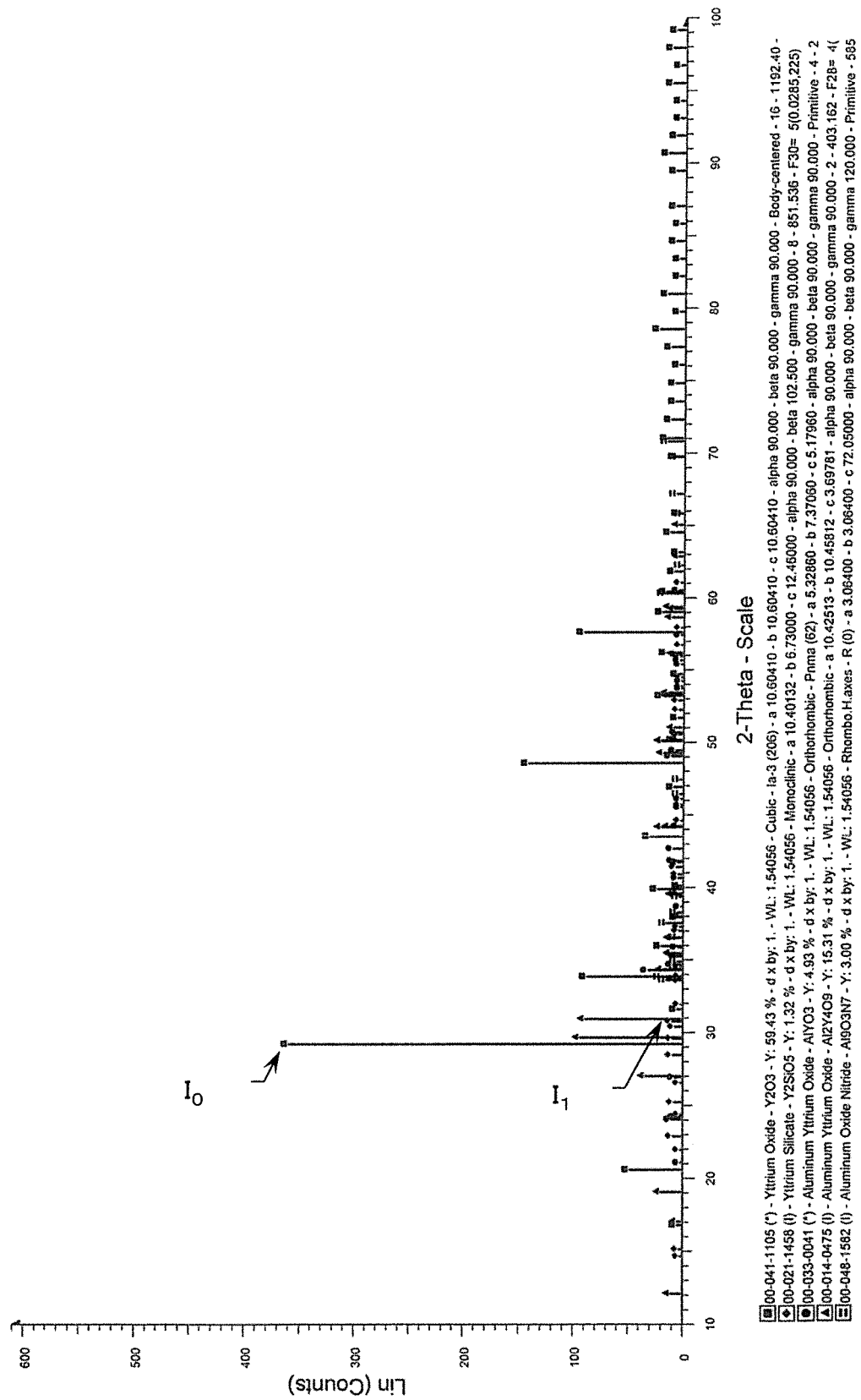
FIG. 3 is an example of an X-ray diffraction chart of the outer peripheral surface of the gas passage pipe shown in FIG. 1.

FIG. 2 is an example of an X-ray diffraction chart of the inner peripheral surface of the gas passage pipe shown in FIG. 1, and FIG. 3 is an example of an X-ray diffraction chart of the outer peripheral surface of the gas passage pipe shown in FIG. 1.

The plasma processing apparatus 10 of the present disclosure shown in FIG. 1 is, for example, a plasma etching apparatus, and has a chamber 1 in which a member W to be processed such as a semiconductor wafer is arranged, an upper electrode 2 arranged on the upper side in the chamber 1, and a lower electrode 3 arranged opposed to each other on the lower side in the chamber 1.

The upper electrode 2 contains an electrode plate 2b having a large number of gas passage pipes 2a for supplying the plasma generating gas G into the chamber 1, and a holding member 2e having a diffusion part 2c which is an internal space for diffusing the plasma generating gas G internally and a large number of introduction holes 2d for introducing the diffused plasma generating gas G into the gas passage pipes 2a.

Then, the plasma generating gas G discharged in the form of a shower from the gas passage pipes 2a becomes plasma by supplying high frequency power from the high frequency power supply 4, and then it forms a plasma space P. The electrode plate 2b and the gas passage pipes 2a may be collectively referred to as a shower plate.

In FIG. 1(a), since the gas passage pipes 2a are small, only the positions are shown, and the detailed configuration is shown in FIG. 1(b).

Among these members, for example, the upper electrode 2, the lower electrode 3, and the high-frequency power supply 4 form a plasma generating apparatus.

Here, examples of the plasma generating gas G include fluorine-based gases such as $SF_6$, $CF_4$, $CHF_3$, $ClF_3$, $NF_3$, $C_4F_8$, and HF, and chlorine-based gases such as $Cl_2$, HCl, $BCl_3$, and $CCl_4$. The gas passage pipe 2a is an example of a member for a plasma processing apparatus. Hereinafter, it may be referred to as a member for a plasma processing apparatus 2a.

The lower electrode 3 is, for example, a susceptor made of aluminum, and an electrostatic chuck 5 is placed on the susceptor and holds the member W to be processed by an electrostatic adsorption force.

Then, a coating film formed on the surface of the member W to be processed is etched by ions and radicals contained in plasma.

The gas passage pipe 2a, which is the member for the plasma processing apparatus 2a of the present disclosure, is made of, for example, a cylindrical ceramic sintered body containing yttrium oxide as a main component, and its inner peripheral surface and a discharge side end surface become surfaces exposed to the plasma generating gas G.

The ceramic sintered body of the present disclosure contains yttrium oxide having a high corrosion resistance to the plasma generating gas G as a main component and contains yttrium silicate. A ratio ($I_1/I_0$) of a maximum peak intensity $I_1$ of yttrium silicate having a diffraction angle $2\theta$ of 30° to 32° with respect to a maximum intensity $I_0$ of yttrium oxide having a diffraction angle $2\theta$ of 28° to 30°, which is obtained by an X-ray diffraction method, is 0.03 or more and 0.12 or less.

Yttrium silicate is less likely to be eroded than an amorphous part of the grain boundary phase, and when the ratio ($I_1/I_0$) is 0.03 or more, the corrosion resistance to plasma is increased due to a reduction of particles generated from the grain boundary phase since the compressive stress on the amorphous part of the grain boundary phase and the crystal particles of yttrium oxide is applied. On the contrary, when the ratio ($I_1/I_0$) is 0.12 or less, the content of yttrium silicate having a larger linear expansion coefficient than yttrium oxide is suppressed in an appropriate range, so that cracks are less likely to occur even if heating and cooling are repeated. The ratio ($I_1/I_0$) may be 0.04 or more and 0.1 or less.

Here, in the X-ray diffraction chart shown in FIG. 2, the ratio ($I_1/I_0$) is 0.08, and in the X-ray diffraction chart shown in FIG. 3, the ratio ($I_1/I_0$) is 0.04, and the composition formula of yttrium silicate is Y2SiO5 in both cases.

Further, the ceramic sintered body of the present disclosure may contain yttrium aluminum oxide which is at least one of YAP ($AlYO_3$), YAM ($Al_2Y_4O_9$) and YAG ($Al_5Y_3O_{12}$).

Since these yttrium aluminum oxides are less likely to be eroded than an amorphous part of the grain boundary phase, and moreover the compressive stress on the amorphous part and the crystal particles of yttrium oxide is applied, particles generated from the grain boundary phase are reduced. Therefore, the ceramic sintered body satisfying the above constitution has even higher corrosion resistance.

The presence of yttrium oxide, yttrium silicate and yttrium aluminum oxide can be confirmed by identifying it with an X-ray diffraction apparatus using CuK$\alpha$ rays. The content of each component can be determined by using, for example, the Rietveld method. Here, the main component in the present disclosure refers to a component that accounts for 90% by mass or more of the total 100% by mass of all the components constituting the ceramic sintered body.

Further, the member for the plasma processing apparatus 2a of the present disclosure is made of the ceramic sintered body of the present disclosure, and its inside is a cylindrical body which serves as a flow path for the plasma generating gas G. The member for the plasma processing apparatus 2a of the present disclosure may contain a larger amount of yttrium silicate in the inner peripheral surface of the cylindrical body than the outer peripheral surface of the cylindrical body.

Additionally, the member for the plasma processing apparatus 2a of the present disclosure may contain a larger amount of yttrium aluminum oxide in the inner peripheral surface of the cylindrical body than the outer peripheral surface of the cylindrical body.

When the inner peripheral surface of the cylindrical body contains a larger amount of yttrium silicate or yttrium aluminum oxide than the outer surface of the cylindrical body, since the corrosion resistance of the inner peripheral surface directly exposed to the plasma generating gas G becomes higher than the outer peripheral surface exposed to the plasma generating gas G, it can be used for a long period of time.

Further, in the member for the plasma processing apparatus 2a of the present disclosure, the maximum peak intensity $I_1$ on the inner peripheral surface of the cylindrical body may be larger than the maximum peak intensity $I_1$ on the outer peripheral surface of the cylindrical body.

With such a constitution, yttrium silicate contained in the inner peripheral surface of the cylindrical body has higher crystallinity than yttrium silicate contained in the outer peripheral surface of the cylindrical body, so that a higher compressive stress is applied to the amorphous part and crystal particles of yttrium oxide, and particles generated from the grain boundary phase is reduced.

In addition to yttrium oxide, the ceramic sintered body of the present disclosure may contain, for example, at least one element of molybdenum, potassium, sodium, tungsten, and vanadium.

To confirm these elements, first, a laser is irradiated onto the surface of the sintered ceramic body by using a laser ablation system. Then, the number of ion count of the elements evaporated from the surface can be detected by the ICP-MS method by using an ICP mass spectrometer.

In the ceramic sintered body of the present disclosure, when the number of ion count of yttrium is 100, the ratio of the ion count of each element to yttrium is, for example, 0.1 to 0.6 for molybdenum, 0.01 to 0.1 for potassium, 0.01 to 0.1 for sodium, 0.01 to 0.1 for tungsten, and 0.01 to 0.1 for vanadium.

In particular, when the ceramic sintered body of the present disclosure is a cylindrical body, it is preferable that the outer peripheral surface of the cylindrical body contains at least one of molybdenum, tungsten, and vanadium, which are refractory metals, more than the inner peripheral surface of the cylindrical body.

Figure 4A:
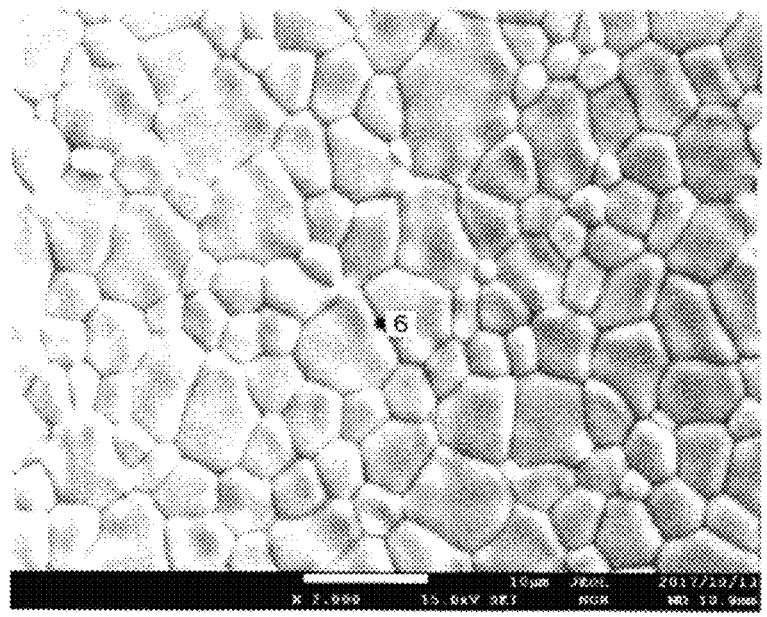
FIG. 4(a) is an electron micrograph of the inner peripheral surface of the gas passage pipe shown in FIG. 1.
Figure 4B:
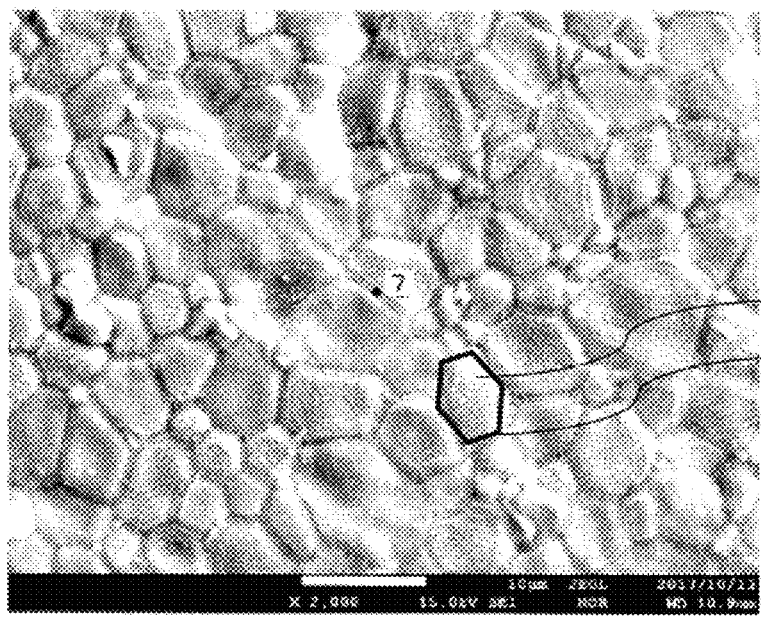
FIG. 4(b) is an electron micrograph of the outer peripheral surface of the gas passage pipe shown in FIG. 1.

FIG. 4(a) is an electron micrograph of the inner peripheral surface of the gas passage pipe shown in FIG. 1, and FIG. 4(b) is an electron micrograph of the outer peripheral surface of the gas passage pipe shown in FIG. 1.

When the elements at measurement points 6 and 7 of each grain boundary phase are detected by the wavelength dispersive X-ray analysis method by using a field emission electron microprobe analyzer (FE-EPMA) (JXA-8530A manufactured by JEOL Ltd.), it can be seen that oxygen and yttrium are contained in the measurement point 6, and oxygen, yttrium, sodium and molybdenum are contained in the measurement point 7. The content of molybdenum in a total of 100% by mass of the contents of oxygen, yttrium, sodium, and molybdenum is 1.6% by mass.

Further, the outer peripheral surface of the cylindrical body which is the gas passage pipe 2a may include a crystal particle 9 having a convex part 8 extending outward.

With such crystal particle 9, when the gas passage pipe 2a is adhered to a member to be adhered such as the electrode plate 2b, the anchor effect works within the surface of the exposed crystal particle, and thus the reliability of the adhered member is improved for a long period of time.

In the electron micrograph shown in FIG. 4(b), the crystal particle 9 has a plurality of convex parts 8.

Next, an example of the method for manufacturing the ceramic sintered body of the present disclosure will be described.

First, powder containing yttrium oxide having a purity of 99% as a main component (hereinafter referred to as yttrium oxide powder), a wax, a dispersant and a plasticizer are prepared. The other component in the yttrium oxide powder is silicon dioxide.

Here, in the case of obtaining a ceramic sintered body containing yttrium aluminum oxide, aluminum oxide may be further contained in the yttrium oxide powder.

With respect to 100 parts by mass of the yttrium oxide powder, the wax is 13 parts by mass or more and 14 parts by mass or less, the dispersant is 0.4 parts by mass or more and 0.5 parts by mass or less, and the plasticizer is 1.4 parts by mass or more and 1.5 parts by mass or less.

Then, the yttrium oxide powder, the wax, the dispersant, and the plasticizer, all of which are heated to 100° C. or higher, are contained in a resin container. At this point, the wax, the dispersant, and the plasticizer are in liquid form. Next, this container is set in a stirrer, and the container is rotated and revolved for 3 minutes (a rotating and revolving kneading process) to stir the yttrium oxide powder, the wax, the dispersant and the plasticizer to obtain a slurry.

Then, the obtained slurry is filled in a syringe, and the slurry is defoamed while rotating and revolving the syringe for 1 minute by using a defoaming tool.

Next, the syringe filled with the defoamed slurry is attached to an injection molding machine, and the slurry is injected into an inner space of a molding die while the temperature of the slurry is maintained at 90° C. or higher to obtain a cylindrical molded body. Here, the flow path the slurry of the injection molding machine passes through may also be maintained at 90° C. or higher.

Further, since the outer peripheral surface of the molded body is formed by the transfer of the inner peripheral surface of the molding die to be abutted and the sintering described later, a member for a plasma processing apparatus having a convex part of the crystal particle extending outward can be obtained by using a molding die having an inner peripheral surface including a concave part.

A cylindrical sintered body can be obtained by sequentially degreasing and sintering the obtained molded product. Here, the sintering atmosphere may be an air atmosphere, the sintering temperature may be 1600° C. or higher and 1800° C. or lower, and the holding time may be 2 hours or longer and 4 hours or less.

To obtain a member for a plasma processing apparatus in which the maximum peak intensity $I_1$ on the inner peripheral surface of the cylindrical body is larger than the maximum peak intensity $I_1$ on the outer peripheral surface of the cylindrical body, at least the atmosphere surrounded by the inner peripheral surface of the cylindrical body may be controlled to have less number of floating impurities than the atmosphere outside this range.

The present disclosure is not limited to the foregoing embodiment, and various changes, improvements, combinations, or the like can be made without departing from the scope of the present disclosure.

In the example shown in FIG. 1, the member for the plasma processing apparatus 2a is arranged in the chamber 1 and is shown as the gas passage pipe 2a for generating stable plasma from the plasma generating gas G, but it may be a member that supplies the plasma generating gas G to the chamber 1, and a member that discharges the plasma generating gas G from the chamber 1.

EXPLANATION OF SYMBOLS

1: chamber
2: upper electrode
2a: member for plasma processing apparatus, gas passage pipe
2b: electrode plate
2c: diffusion part
2d: introduction hole
2e: holding member
3: lower electrode
4: high frequency power supply
5: electrostatic chuck
6, 7: measurement point
8: convex part
9: crystal particle
10: plasma processing apparatus

The invention claimed is:

1. A member for a plasma processing apparatus comprising:
a ceramic sintered body comprising yttrium oxide as a main component, and containing yttrium silicate, wherein a ratio ($I_1/I_0$) of a maximum peak intensity $I_1$ of yttrium silicate having a diffraction angle 2θ of 30° to 32° with respect to a maximum intensity $I_0$ of yttrium oxide having a diffraction angle 2θ of 28° to 30°, obtained by an X-ray diffraction method, is 0.03 or more and 0.12 or less; and
a cylindrical body which serves as a flow path for a plasma generating gas, wherein an inner surface of the cylindrical body contains a larger amount of yttrium silicate than an outer surface of the cylindrical body.

2. The member for a plasma processing apparatus according to claim 1, wherein the ceramic sintered body contains yttrium aluminum oxide which is at least one of YAP (AlYO$_3$), YAM (Al$_2$Y$_4$O$_9$) and YAG (Al$_5$Y$_3$O$_{12}$).

3. The member for the plasma processing apparatus according to claim 1, wherein a maximum peak intensity $I_1$ on the inner surface of the cylindrical body is larger than a maximum peak intensity $I_1$ on the outer surface of the cylindrical body.

4. The member for the plasma processing apparatus according to claim 1, wherein the inner surface of the cylindrical body contains a larger amount of yttrium aluminum oxide than the outer surface of the cylindrical body.

5. The member for the plasma processing apparatus according to claim 1, wherein the outer surface of the cylindrical body comprises a crystal particle having a convex part extending outward.

* * * * *